United States Patent [19]

Wei

[11] Patent Number: 5,391,502
[45] Date of Patent: Feb. 21, 1995

[54] PER-WAFER METHOD FOR GLOBALLY STRESSING GATE OXIDE DURING DEVICE FABRICATION

[75] Inventor: Yi-Hen Wei, Santa Clara, Calif.

[73] Assignee: VLSI Technology, Inc., San Jose, Calif.

[21] Appl. No.: 113,497

[22] Filed: Aug. 27, 1993

[51] Int. Cl.$^6$ ............................................. G01R 31/26
[52] U.S. Cl. ........................................ 437/8; 437/170; 324/71.5
[58] Field of Search ............................ 437/8, 170, 983; 148/DIG. 12

[56] References Cited

U.S. PATENT DOCUMENTS

| | | | |
|---|---|---|---|
| 3,422,528 | 1/1969 | Okumura | 437/170 |
| 4,360,964 | 11/1982 | Gilly et al. | 437/8 |
| 4,760,032 | 7/1988 | Turner | 437/8 |
| 4,975,381 | 12/1990 | Taka et al. | 437/31 |

Primary Examiner—Olik Chaudhuri
Assistant Examiner—Brian K. Dutton
Attorney, Agent, or Firm—Flehr, Hohbach, Test, Albritton & Herbert

[57] ABSTRACT

Gate oxide on a semiconductor wafer is effectively stressed on a per-wafer basis during fabrication. Because it was effectively stressed, gross testing the gate oxide after device fabrication provides a good indication whether a completed MOS device will be subject to infant mortality. After the gate oxide is formed, a source of overvoltage may be coupled between the raw oxide and the underside of the wafer, to accelerate stress due to defects in the oxide. Alternatively, the oxide may be stressed after deposition of the gate material by coupling a source of overvoltage directly to the gate material and to a probe on the underside of the wafer. The oxide may also be stressed after patterning and definition of the gate material by coupling a source of over-voltage to all of the gates simultaneously, preferably using a mercury probe, plasma or a conductive conforming membrane, and to a probe on the underside of the wafer. The overvoltage is sufficiently large to stress defect-containing oxide, but not to breakdown good oxide. After stress, prior art procedures to complete fabrication, post-fabrication burn-in and testing may be carried out. Because the present invention effectively stresses 100% of the gate oxide, fabricated ICs containing MOS devices whose oxide has defects will generally not pass GO/NO GO post-fabrication testing. In this manner, ICs likely to fail due to infant mortality are identified during post-fabrication testing and discarded.

16 Claims, 3 Drawing Sheets

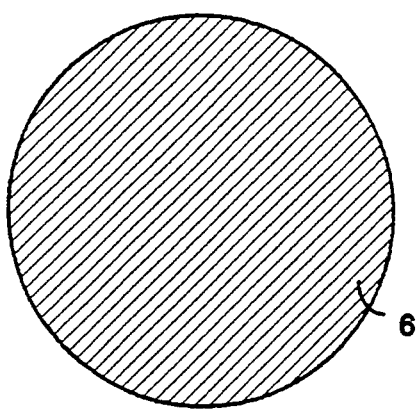
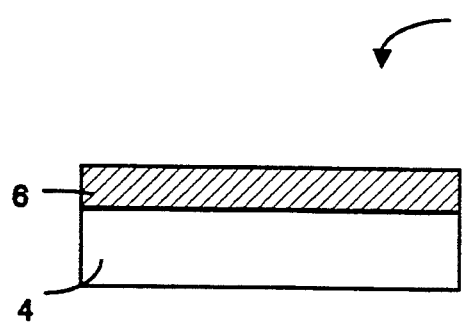
FIG. 1A
(PRIOR ART)
FIG. 1B
(PRIOR ART)
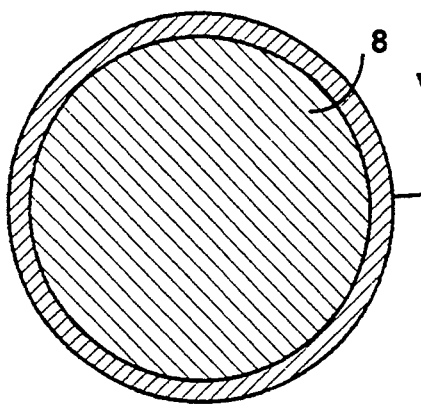
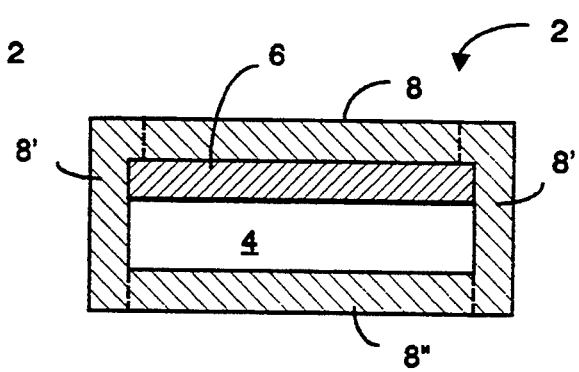
FIG. 1C
FIG. 1D
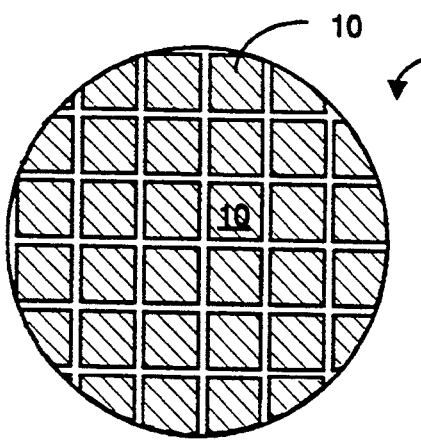
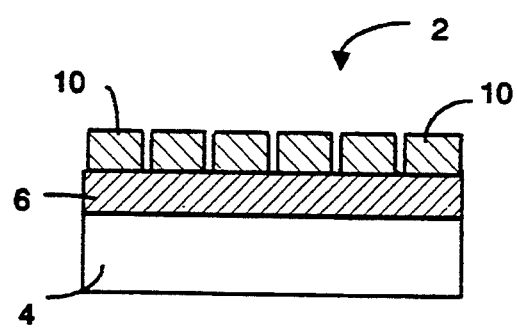
FIG. 1E
(PRIOR ART)
FIG. 1F
(PRIOR ART)

PER-WAFER METHOD FOR GLOBALLY STRESSING GATE OXIDE DURING DEVICE FABRICATION

FIELD OF THE INVENTION

The invention relates to quality control testing of integrated circuits ("ICs"), and more particularly to a per-wafer method for stressing the gate oxide of a wafer during device fabrication, to accelerate the failure of defect-containing completed metal-oxide-semiconductor ("MOS") devices during post-fabrication testing.

BACKGROUND OF THE INVENTION

Using well known techniques, integrated circuits ("ICs") are fabricated on a substrate by forming various depositions, layer by layer. For example, an IC containing metal-oxide-semiconductor ("MOS") devices has a thin layer of oxide over which a layer of gate material (e.g., polysilicon) is deposited and then defined. The MOS device source and drain regions are then formed, either by photolithography or by using the defined gates as a self-aligning mask.

Normal backend processing that forms electrical interconnects completes the fabrication of the IC. The IC is then functionally tested to detect and screen-out defective units, which should not be assembled and delivered to customers.

For a variety of reasons, defects can exist randomly anywhere within the IC structure being fabricated. In ICs containing MOS devices, the thin gate oxide is a substantial factor contributing to failures, among other causes, such as metal electron migration or particulates.

While some defects manifest failure during the functionality test, other defects survive the functionality test, but can cause the premature failure ("infant mortality") of the completed IC. Infant mortality refers to completed, apparently good, devices that fail within about 20% of the expected mean time between failures ("MTBF").

Initially, ICs containing weak oxide (e.g., gate oxide with defects) will function normally. However after the completed IC has been operated sufficiently long, stress sufficient to wear-out weak gate oxide accumulates, which causes the IC to fail. Statistically, IC failure typically has a bimodal distribution failure pattern: ICs either fail very soon after actual operation in the field (infant mortality), or survive essentially forever.

To promote good product quality, manufacturers wish to weed-out completed ICs that are destined to fail prematurely in the field. Thus, ICs are subjected to post-fabrication burn-in and stress procedures. Ideally such procedures will accelerate the effects of defects, forcing failures to appear so that ICs containing defects will fail during such procedures. Such devices are then screened-out, rather than delivered to customers, where-upon the devices will fail prematurely after operation in the field. Typical prior art screening procedures are described in the text "Integrated Circuit Engineering" by Glaser and Subak-Sharpe, published by Edison-Westley (May 1979). In the prior art, burn-in typically involves subjecting the completed ICs to a temperature of about 100° C. to 150° C., for perhaps 24 to 96 hours, with power supply voltages being applied to the IC at about 160% nominal voltage. If desired, ambient pressure and humidity may also be varied.

The increased temperature and power supply levels should accelerate stress resulting from any defects, thereby causing ICs containing such defects to fail during burn-in. In practice, most of the integrated circuit input ports are maintained at a fixed (DC) voltage. Alternatively, other procedures present a simple vector (AC) voltage pattern to the integrated circuit input ports to change internal device node voltages, thereby increasing the number of transistors subjected to stress.

Unfortunately, because these prior art procedures subject ICs to stress after fabrication is complete, it is not always possible to effectively stress every single transistor in each integrated circuit. For example, physical inaccessible may prevent applying over-voltage directly to some transistors. Other transistors, while accessible, may require very complicated vector patterns involving longer burn-in time and expensive equipment.

Thus prior art post-fabrication stressing tends to be either simple but inadequate, or expensive and time consuming. In either event, prior art procedures fail to realistically stress all devices on a completed IC. The result is that many defect-containing ICs are inadequately stressed, and therefore survive burn-in and functionality testing, only to fail prematurely in the field due to infant mortality.

What is needed is an improved method to more effectively stress the gate oxide of every device on an IC wafer. Preferably such method should apply stress on a per-wafer basis to 100% of the gate oxide. Further, such method should be applicable before IC fabrication has been completed. The present invention discloses such method.

SUMMARY OF THE INVENTION

All MOS devices on an IC have gate oxide, which oxide may include defects that are a prime cause of infant mortality of completed ICs. While other factors also give rise to defects, the present invention recognizes that grossly testing for defective gate oxide that has been effectively stressed provides a good indication whether a completed MOS device will be subject to infant mortality.

Before IC fabrication is complete, the present invention globally stresses 100% of the gate oxide over an entire wafer on a per-wafer basis. This rapidly provides the same defect-failure acceleration as if each individual MOS device on the wafer were fully fabricated and then subjected to effective gate oxide stress. After global gate oxide stress according to the present invention, fabrication and post-fabrication IC testing can occur as in the prior art.

Because the present invention effectively stresses 100% of the gate oxide, defect-containing MOS devices typically fail a simple post-fabrication GO/NO GO test, and are discarded. In this manner, ICs that might otherwise pass post-fabrication testing only to fail due to infant mortality are not sold. By contrast, the prior art applies stress on a per-IC and per-device basis after IC fabrication is complete, and cannot adequately stress 100% of the completed devices. As a result, in the prior art many ICs pass stress, burn-in and other procedures, only to fail prematurely in field operation, due to infant mortality.

According to the present invention, gate oxide may be subjected to global stress immediately after it has been formed, or after deposition of the overlying gate polysilicon or metal material, or after etching of the gate material to define individual gates. In each instance, 100% of the oxide is stressed on a per-wafer basis.

In a first embodiment, stress is applied after formation of the gate oxide and before fabrication of the overlying gate material. A source of overvoltage is coupled between the exposed oxide surface and the lower wafer surface. The oxide under stress acts like the dielectric in a parallel plate capacitor whose two plates are coupled to the two terminals of the overvoltage source. One plate is liquid mercury or plasma that contacts the raw gate oxide surface, and the second plate is a electrode that makes contact with the lower substrate surface.

More preferably, stress is applied after formation of the gate material that overlies the gate oxide. Again, the oxide acts like the dielectric in a parallel plate capacitor coupled to a source of overvoltage. One plate is the gate material, and the second plate is an electrode on the underside of the substrate.

Alternatively, the oxide is subjected to global stress after the overlying gate material has been defined to form a plurality of gates, each gate being associated with an underlying MOS device. In this third embodiment, the gate oxide acts like the dielectric in a parallel plate capacitor coupled across a source of overvoltage. Such capacitor comprises a plurality of parallel-coupled parallel plate capacitors, wherein the individual gates are one of the plates, and wherein a common electrode is the second plate. In this embodiment, the plurality of gates may be coupled together using mercury, a conductive conforming membrane, or plasma.

In each embodiment, the overvoltage source has a magnitude less than the nominal breakdown voltage for good gate oxide, but sufficiently high to force defective gate oxide to fail a post-fabrication GO/NO GO test. Preferably the overvoltage is applied for several minutes while the wafer is at elevated temperature, e.g., about 100° C. to 150° C.

Other features and advantages of the invention will appear from the following description in which the preferred embodiments have been set forth in detail, in conjunction with the accompanying drawings.

BRIEF DESCRIPTION OF THE DRAWINGS

FIGS. 1A and 1B are plane and side views of a semiconductor wafer with a layer of gate oxide formed atop the substrate, according to the prior art;

FIGS. 1C and 1D are plane and side views of the wafer of FIG. 1A and 1B, after deposition of gate material, depicting removal of gate material from the wafer perimeter;

FIGS. 1E and 1F are plane and side views of a wafer such as that in FIG. 1C, after the gate material has been patterned to define a plurality of gates;

DETAILED DESCRIPTION OF THE PREFERRED EMBODIMENTS

Figure 2A:
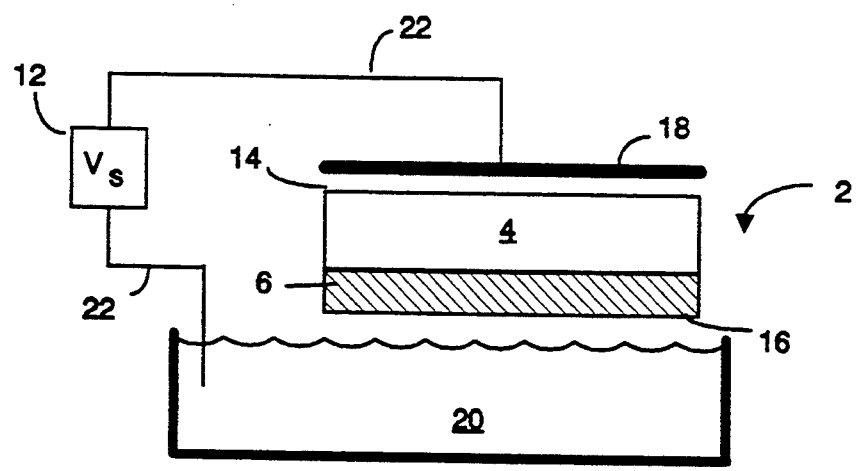
FIG. 2A depicts a first method of globally stressing a raw gate oxide layer, according to the present invention.

FIGS. 1A and 1B depict a semiconductor wafer 2 as including a substrate 4 whereon a layer of gate oxide 6 has been formed. It will be appreciated that the Figures herein are not to scale. For example, gate oxide 6 may be as thin as 100 Å, whereas substrate 4 may be 100 μm or thicker.

In FIGS. 1C and 1D, a layer of gate material 8 has been deposited over the gate oxide 6. Typically gate material 8 is polysilicon or, in older fabrication processes, metal. As shown in FIG. 1D, deposition of material 8 can result in material 8 covering not merely the top of the oxide 6, but, undesirably, also the sides and bottom of the wafer. As will be described, one embodiment of the present invention stresses wafer 2 after deposition, but before patterning, of material 8. To prevent material 8 electrically shorting together the upper and lower surfaces of wafer 2, regions 8' are removed, preferably by etching. Alternatively, a scribe line may be formed, e.g., with a laser, in the upper perimeter surface of oxide 8 to prevent such electrical shorting. Thus, FIGS. 1C and 1D depict wafer 2 with the perimeter region of gate material 8 removed or scribed, such that no short-circuit remains.

During normal wafer fabrication, however, the perimeter etching or scribing depicted in FIGS. 1C and 1D is not necessary, and fabrication can proceed directly to what is shown in FIG. 1E. The gate material 10 is patterned and typically etched to define a plurality of individual gates 10. While FIG. 1E depicts approximately two dozen such gates 10, it is understood that wafer 2 can actually contain several million (or more) individually defined gates 10.

Those skilled in the art will appreciate that each gate 10 in FIG. 1E or 1F is associated with an underlying metal-oxide-semiconductor or MOS transistor device. Typically gates 10 are used as dopant masks to assist in the formation of drain and source regions adjoining the gate. Layers of inter-level dielectric ("ILD"), first level metal, inter-metal-oxide, second level metal are then formed, and normal backend interconnect processing completes wafer fabrication. After burn-in and wafer sort testing, the wafer is cut into individual ICs, each containing many MOS devices. ICs that survived the tests are deemed good, are packaged, and sold.

As noted, the present invention advantageously stresses wafer 2 before fabrication is complete. In the embodiments shown in FIGS. 2A and 2B, such stress is applied to gate oxide 6 while it is still in a raw, e.g., unprotected and uncovered state.

In FIG. 2A, for example, the wafer of FIG. 1B is globally stressed by coupling an overvoltage Vs from a voltage source 12 across the raw oxide 6. The backside 14 of substrate 4 is coupled via an electrode 18 and lead 22 to one terminal of overvoltage source 12. Oxide layer 6 is coupled to the remaining Vs terminal via lead 22 and contact with a conforming liquid conductor probe 20, mercury for example, while electrode 18 preferably is a mercury probe. Alternatively, electrode 20 may be a conductive conforming membrane, e.g., rubber.

Essentially oxide 6 acts like the dielectric in a parallel plate capacitor, the first plate being electrode 18, and the second plate being the mercury probe or conductive conforming membrane 20. For ease of illustration, FIG.

2A shows a gap between electrode 18 and surface 14, and a gap between the surface of mercury (or conductive conforming membrane) 20 and the raw exposed surface 16 of oxide 6. Of course in practice no such gap exists. Electrode 18 makes intimate electrical contact with surface 14, while oxide surface 16 makes intimate contact with mercury (or conducting conforming membrane) 20.

The magnitude of Vs is selected to stress and accelerate failure in weak oxides, but not to damage good oxides. For example, if the nominal oxide breakdown voltage is 20 VDC, Vs is set to about 15 VDC, e.g., about 75% of nominal. In practice, defect-containing oxide that would eventually breakdown at perhaps 12-15 VDC will be forced to breakdown during stress, according to the present invention. Good oxide, e.g., relatively defect free oxide, will not breakdown.

Preferably the Vs overvoltage is applied while the wafer 2 is exposed to a temperature range of perhaps 20° C. to 150° C. The duration of this burn-in Vs and temperature stress may be as short as a few minutes, e.g., about five minutes or less. Vs may be DC, or may be pulsed or ramped. If desired, ambient pressure and/or humidity may also be varied, although their stress contribution is secondary as compared to defects in the gate oxide.

It is apparent from FIG. 2A that 100% of the gate oxide is subjected to stress simultaneously, at a time when wafer fabrication is not yet complete. This is in contrast to prior art stress schemes, where stress occurs after IC fabrication is complete and cannot always be effectively applied to 100% of the devices on a wafer. The stress created by the present invention is very effective and will force failure of many MOS devices whose defect-containing oxide might otherwise survive conventional post-fabrication stress, burn-in and test procedures.

Figure 2B:
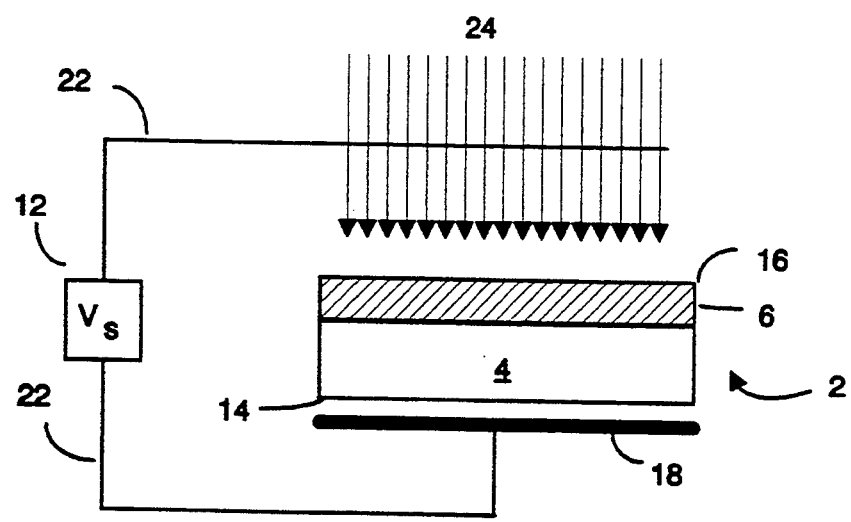
FIG. 2B depicts an alternative method of globally stressing a raw gate oxide layer, according to the present invention.

Alternatively, the raw gate oxide 6 may be tested by making electrical contact using a plasma (e.g., nitrogen or argon), depicted symbolically as rays 24 in FIG. 2B. In FIG. 2B, the electrically conductive plasma field 24 couples surface 16 of the gate oxide 6 to overvoltage source 12 in the same manner as mercury (or conducting conforming membrane) 20 in FIG. 2A. The conductive plasma 24 acts like one plate of a parallel place capacitor, electrode 18 being the second plate, with oxide 6 disposed therebetween. Again, electrode 18 is preferably a mercury probe.

While the embodiments of FIGS. 2A and 2B can provide global stress to a raw gate oxide 6, doing so is not especially preferred. Good wafer fabrication practice calls for protectively covering the surface 16 of gate oxide 6 within about 2-4 hours of creation of the oxide. Allowing surface 16 of gate oxide 6 to remain otherwise exposed, e.g., during stress according to the embodiments of FIGS. 2A and 2B, can result in impurities entering the oxide, possibly introducing defects into a wafer otherwise defect free. Also, in the embodiments of FIGS. 2A and 2B there is a risk of contaminating oxide 6, either with mercury or conducting conforming membrane 20 or plasma 24. Further, plasma 24 can present more ohmic resistance than does mercury or conducting conforming membrane 20.

Figure 3A:
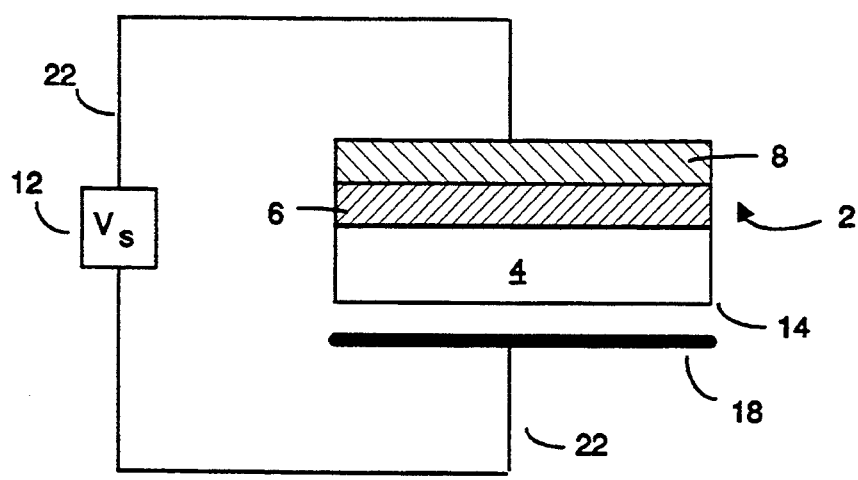
FIG. 3A depicts a method of globally stressing an oxide layer after deposition of gate material, according to the present invention.
Figure 3B:
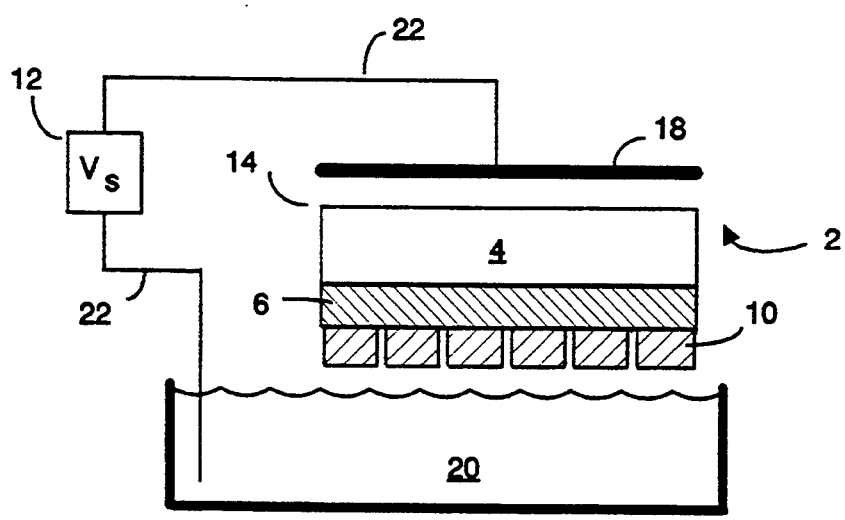
FIG. 3B depicts a first method of globally stressing an oxide layer after deposition and definition of the gate material, according to the present invention.
Figure 3C:
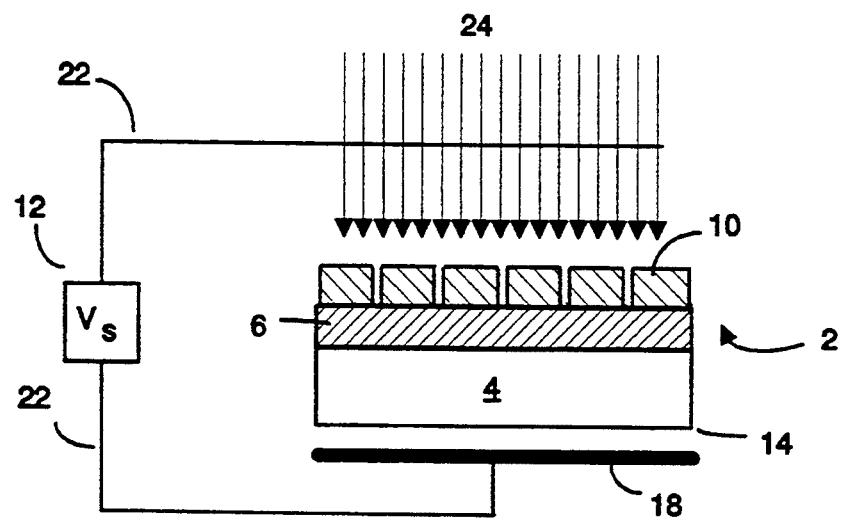
FIG. 3C depicts an alternative method of globally stressing a gate oxide layer after deposition and definition of the gate material, according to the present invention.

More preferred embodiments of the present invention are depicted in FIGS. 3A, 3B and 3C. In FIG. 3A, stress occurs after deposition of the conductive gate material 8 atop gate oxide surface 16. The presence of this typically polysilicon, polycide, or metal layer 8 protects gate oxide 6 against the introduction of impurities or contaminants, an advantage not found in the embodiment of FIGS. 2A and 2B. Further, applying stress after deposition of the gate material 8 can take into account such defects as may have been introduced during gate material 8 deposition. Such defects are secondary, however, as contrasted to weaknesses or defects already present in the gate oxide itself.

As described with reference to FIG. 1D, it may be necessary to etch away the gate material 8 around the perimeter of wafer 2 to break what might otherwise be a short circuit between gate material above oxide 6 (e.g., material 8), and on the bottom (e.g., material 8") and sides (e.g., material 8') of the substrate 4.

In FIG. 3A, the oxide 6 essentially acts like the dielectric of a parallel plate capacitor, whose first plate is the gate material 8 deposited on surface 16 of oxide 8, and whose second plate is electrode 18. Depending upon the quality of the deposition of gate material 8 to the underside of substrate 4 (see FIG. 1D), electrode 18 may be the gate material 8 deposited on the underside of the substrate during deposition. Alternatively, the gate material 8 deposited on the underside of the substrate could be removed, and a mercury probe used as electrode 18.

It is apparent from FIG. 3A that 100% of the gate oxide is stressed by the overvoltage source 12. Again, the desired result is that marginally defective oxides will be so effectively stressed as to readily fail post-fabrication GO/NO GO testing.

FIGS. 3B and 3C depict embodiments wherein stress is applied after gate material 8 has been patterned and etched, to define a plurality of individual gates 10. Applying stress after definition of gate material 8 can take into account defects resulting from the formation of gates 10.

With reference to FIGS. 3B and 3C, one could theoretically stress the oxide 6 by coupling overvoltage supply 12 to the plurality of gates 10 using a plurality of probes (not shown), the probes contacting the various gates 10. However it is more realistic and practical to couple supply 12 to all gates 10 simultaneously using a conductive conforming membrane 20 or a liquid conductor, e.g., mercury 20 (FIG. 3B), or using a conductive plasma (FIG. 3C) so that all individual gates can be simultaneously contacted.

In fabricating MOS devices, it is often desired to form sidewalled spacers. Such spacers are formed by depositing one or more layers of dielectric material atop gate material 8, and then etching-back the dielectric material until the upper surface of gate material 8 is again exposed. Thus, it will be appreciated that the above-described embodiment of stressing may be practiced immediately after formation of gate material 8, or after deposition and etch-back of an overlying dielectric material.

To recapitulate, the present invention stresses 100% of the gate oxide simultaneously on a per-wafer basis before device fabrication is complete. So doing achieves the same device failure acceleration that might be attained in the prior art, assuming of course that each completed device associated with each gate 10 could actually be effectively stressed.

The present invention is not concerned with what specifically caused the stressed gate oxide to fail during post-fabrication GO/NO GO testing. Instead, the present invention recognizes that once the gate oxide has been effectively stressed, according to the present invention, post-fabrication burn-in screening of the gate oxide is a good method of weeding-out wafers likely to later exhibit infant mortality. Post-fabrication testing of devices subjected to stress according to the present invention may occur using the same testing procedures as in the prior art.

In some applications where stress has been created according to the present invention, full post-fabrication burn-in may be dispensed with where only gate oxide was of concern. A straightforward GO/NO GO test would be sufficient. However since other factors, e.g., defective metal traces, can also cause completed ICs to fail, it may be desired to still perform a full conventional burn-in process. The present invention advantageously stresses gate oxide 100% without requiring complex vectors during burn-in, without requiring excessive time, or expensive equipment.

Modifications and variations may be made to the disclosed embodiments without departing from the subject and spirit of the invention as defined by the following claims.

What is claimed is:

1. A per-wafer method of stressing gate oxide on a wafer including a substrate and a layer of said gate oxide thereon, said gate oxide fabricated to have a desired breakdown voltage $V_{nominal}$, the method comprising a step of coupling, prior to deposition of gate material overlying said gate oxide, a source of voltage $V_S$ between an upper surface of said gate oxide and a lower surface of said wafer for less than about twenty-five minutes;

wherein said voltage $V_S$ has a magnitude less than said desired breakdown voltage $V_{nominal}$.

2. The method of claim 1, wherein said step of coupling includes coupling to said upper surface of said gate oxide using a probe selected from the group consisting of (i) a liquid conductor, (ii) a conductive plasma, and (iii) a conductive conforming membrane.

3. The method of claim 1, wherein said step of coupling includes coupling to said lower surface of said wafer using a probe selected from the group consisting of (i) a liquid conductor, and (ii) an electrode.

4. The method of claim 1, wherein said step of coupling is carried out at a temperature ranging from of about 20° C. to about 150° C.

5. The method of claim 1, wherein said step of coupling is continued for about five minutes.

6. A per-wafer method of stressing gate oxide on a wafer including a substrate, a layer of said gate oxide thereon, and a layer of conductive gate material formed on said layer of said gate oxide, said gate oxide fabricated to have a desired breakdown voltage $V_{nominal}$, the method comprising a step of coupling a source of voltage $V_S$ between an upper surface of said conductive gate material, and a lower surface of said wafer;

wherein said voltage $V_S$ has a magnitude less than said desired breakdown voltage $V_{nominal}$; and wherein said step of coupling is carried out before said layer of conductive gate material is defined to create more than one gate.

7. The method of claim 6, wherein said step of coupling includes coupling to said lower surface of said wafer using a probe selected from the group consisting of (i) a liquid conductor, (ii) a conforming membrane, and (iii) an electrode.

8. The method of claim 6, wherein said gate material is selected from the group consisting of (i) polysilicon, (ii) polycide, and (iii) metal.

9. The method of claim 7, wherein said probe includes an electrode made from said gate material.

10. The method of claim 6, wherein said step of coupling is carried out at a temperature ranging from about 20° C. to about 150° C.

11. The method of claim 6, wherein said step of coupling is continued for less than about five minutes.

12. A per-wafer method of stressing gate oxide on a wafer including a substrate, a layer of said gate oxide thereon, and a layer of conductive gate material formed on said layer of said gate oxide, said gate oxide fabricated to have a desired breakdown voltage $V_{nominal}$, and said layer of conductive gate material being defined into a plurality of separate gates, the method comprising a step of simultaneously coupling a source of voltage $V_S$ between an upper surface of each one of said separate gates and a lower surface of said wafer;

wherein said voltage $V_S$ has a magnitude less than said desired breakdown voltage $V_{nominal}$; and wherein said step of coupling is carried out without depositing over said conductive gate material a metal layer that is removed following said step of coupling.

13. The method of claim 12, wherein said step of coupling includes coupling to said upper surface of each one of said separate gates using a probe selected from the group consisting of (i) a liquid conductor, (ii) a conductive plasma, and ( iii ) a conductive conforming membrane.

14. The method of claim 12, wherein said step of coupling includes coupling to said lower surface of said wafer using a probe selected from the group consisting of (i) a liquid conductor, and (ii) an electrode.

15. The method of claim 12, wherein said step of coupling is carried out at a temperature ranging from about 100° C. to about 150° C.

16. The method of claim 12, wherein said method is carried out after formation and subsequent etch-back of a layer of dielectric material overlying said layer of gate material.

* * * * *